(12) United States Patent
Wu et al.

(10) Patent No.: US 10,643,533 B2
(45) Date of Patent: May 5, 2020

(54) EMISSION CONTROL DRIVING CIRCUIT, EMISSION CONTROL DRIVER AND ORGANIC LIGHT EMITTING DISPLAY DEVICE

(71) Applicant: Kunshan Go-Visionox Opto-Electronics Co., Ltd., Kunshan (CN)

(72) Inventors: Jianlong Wu, Kunshan (CN); Xiuqi Huang, Kunshan (CN); Siming Hu, Kunshan (CN); Hui Zhu, Kinshan (CN)

(73) Assignee: KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 16/293,486

(22) Filed: Mar. 5, 2019

(65) Prior Publication Data
US 2019/0197956 A1    Jun. 27, 2019

Related U.S. Application Data

(63) Continuation of application No. PCT/CN2018/107596, filed on Sep. 26, 2018.

(30) Foreign Application Priority Data
Jan. 19, 2018    (CN) .......................... 2018 1 0054293

(51) Int. Cl.
*G09G 3/30* (2006.01)
*G09G 3/36* (2006.01)
(Continued)

(52) U.S. Cl.
CPC ............. *G09G 3/3233* (2013.01); *G09G 3/20* (2013.01); *G11C 19/28* (2013.01); *G09G 3/3266* (2013.01);
(Continued)

(58) Field of Classification Search
CPC .. G09G 3/32; G09G 3/30; G09G 3/36; G09G 5/00; G06F 3/038
See application file for complete search history.

(56) References Cited

U.S. PATENT DOCUMENTS 7,880,694 B2    2/2011    Chung
2008/0055208 A1*    3/2008    Chung ................. G09G 3/3266
345/76
(Continued)

FOREIGN PATENT DOCUMENTS

CN    103632633 A    3/2014
CN    105185318 A    12/2015
(Continued)

OTHER PUBLICATIONS

PCT International Search Report dated Dec. 29, 2018 in International Application No. PCT/CN2018/107596.
(Continued)

*Primary Examiner* — Pegeman Karimi (57) ABSTRACT

Embodiments of the present application provide a emission control driving circuit, a emission control driver and an organic light emitting display device. The emission control driving circuit includes a first gate voltage control circuit, a second gate voltage control circuit and an isolation circuit.

20 Claims, 6 Drawing Sheets

(51) Int. Cl.
   *G09G 3/3233* (2016.01)
   *G09G 3/20* (2006.01)
   *G11C 19/28* (2006.01)
   *G09G 3/3275* (2016.01)
   *G09G 3/3266* (2016.01)

(52) U.S. Cl.
   CPC ... *G09G 3/3275* (2013.01); *G09G 2310/0267* (2013.01); *G09G 2310/0281* (2013.01); *G09G 2310/0286* (2013.01); *G09G 2330/021* (2013.01)

(56) References Cited

U.S. PATENT DOCUMENTS

| | | | | |
|---|---|---|---|---|
| 2010/0201668 | A1* | 8/2010 | Ko | G09G 3/3677 345/211 |
| 2010/0245300 | A1* | 9/2010 | Chan | G09G 3/3677 345/204 |
| 2012/0050346 | A1* | 3/2012 | Sung | G09G 3/3233 345/690 |
| 2017/0365211 | A1* | 12/2017 | Lee | G09G 3/3233 |

FOREIGN PATENT DOCUMENTS

| | | |
|---|---|---|
| CN | 107527589 A | 12/2017 |
| CN | 206711576 U | 12/2017 |
| CN | 207068442 U | 3/2018 |
| CN | 108230998 A | 6/2018 |
| TW | 201734993 A | 10/2017 |

OTHER PUBLICATIONS

Chinese First Office Action for CN Application No. 201810054293.X dated Jul. 3, 2019.

\* cited by examiner

EMISSION CONTROL DRIVING CIRCUIT, EMISSION CONTROL DRIVER AND ORGANIC LIGHT EMITTING DISPLAY DEVICE

CROSS-REFERENCE TO RELATED APPLICATIONS

This application is a continuation of International Application No. PCT/CN2018/107596 filed on Sep. 26, 2018, which claims priority to Chinese Patent Application No. 201810054293.X filed on Jan. 19, 2018. Both applications are incorporated herein by reference in their entireties.

TECHNICAL FIELD

Embodiments of the present application relate to the field of photoelectric technology, in particular to an emission control driving circuit, an emission control driver and an organic light emitting display device.

BACKGROUND

In recent years, various types of display devices have been developed, such as liquid crystal display devices, plasma display devices, electrowetting display devices, electrophoretic display devices, organic light emitting display devices and so on. The organic light emitting display devices emit lights of specific wavelengths to display images by utilizing the composition of electron-hole pairs in specific materials, and have the advantages of fast response, low power consumption, lightweight, wide color gamut and so on. The existing organic light emitting display devices usually include emission control drivers to control the emission periods of the pixels, but the prior emission control drivers are vulnerable to breakdown damage.

SUMMARY

In view of this, the embodiments of the present application provide an emission control driving circuit, an emission control driver and an organic light emitting display device in order to solve the problem of transistor breakdown in the emission control driving circuit of the organic light emitting display device in the prior art.

A first aspect of the present application provides an emission control driving circuit, including: a first gate voltage control circuit generating a first gate-controlled voltage at a first gate voltage control node according to signals of a first input terminal, a second input terminal and a second power input terminal; a second gate voltage control circuit generating a third gate-controlled voltage at a third gate voltage control node according to the first gate-controlled voltage and the signals of the first input terminal, the second input terminal, a third input terminal, a first power input terminal and the second power input terminal; and an isolation unit, or can be called into an isolation circuit. The isolation circuit is connected between the second power input terminal, the first gate voltage control circuit and the second gate voltage control circuit. When the first gate-controlled voltage is lower than a voltage value of the second power input terminal, the isolation circuit isolates the first gate-controlled voltage from the first gate voltage control circuit and/or the second gate voltage control circuit; or when the third gate-controlled voltage is lower than the voltage value of the second power input terminal, the isolates circuit isolates the third gate voltage control node from the first gate voltage control circuit and/or the second gate voltage control circuit.

In an embodiment, the second gate voltage control circuit further generates a second gate-controlled voltage at a second gate voltage control node, and the emission control driving circuit further includes: an output circuit, or can be called into an output circuit, generating an output signal according to the second gate-controlled voltage, the third gate-controlled voltage, and signals of the first power input terminal and the second power input terminal.

In an embodiment, when the first gate-controlled voltage is lower than the voltage value of the second power input terminal, the isolation circuit isolates the first gate voltage control node from the first gate voltage control circuit and the second gate voltage control circuit. When the third gate-controlled voltage is lower than the voltage value of the second power input terminal, the isolation circuit isolates the third gate voltage control node from the second gate voltage control circuit.

In an embodiment, when the first gate-controlled voltage is lower than the voltage value of the second power input terminal, the isolation circuit isolates the first gate voltage control node from the first gate voltage control circuit. When the third gate-controlled voltage is lower than the voltage value of the second power input terminal, the isolation circuit isolates the third gate voltage control node from the first gate voltage control circuit and the second gate voltage control circuit.

In an embodiment, the first gate voltage control circuit includes a first transistor, a second transistor and a third transistor. A gate of the first transistor is connected to the second input terminal, a source of the first transistor is connected to a gate of the second transistor, and a drain of the first transistor is connected to the first input terminal. A source of the second transistor is connected to the second input terminal, a drain of the second transistor is connected to a source of the third transistor, and the gate of the second transistor is further connected to the second gate voltage control circuit. A gate of the third transistor is connected to the second input terminal, a drain of the third transistor is connected to the second power input terminal, and the source of the third transistor is further connected to the second gate voltage control circuit.

In an embodiment, the first transistor, the second transistor and the third transistor are P-type thin film transistors.

In an embodiment, the second gate voltage control circuit includes a fourth transistor, a fifth transistor, a sixth transistor, a seventh transistor, an eighth transistor and a first capacitor. A gate of the fourth transistor is connected to the third input terminal, a source of the fourth transistor is connected to a source of the fifth transistor, and a drain of the fourth transistor is connected to the gate of the second transistor. A gate of the fifth transistor is connected to the source of the third transistor, and a drain of the fifth transistor is connected to the first power input terminal. A gate of the sixth transistor is connected to the source of the third transistor, a source of the sixth transistor is connected to a source of the seventh transistor, and a drain of the sixth transistor is connected to the third input terminal. A gate of the seventh transistor is connected to the third input terminal, and a drain of the seventh transistor is connected to a source of the eighth transistor. A gate of the eighth transistor is connected to the first input terminal and the output circuit, a drain of the eighth transistor is connected to the first power input terminal, and the source of the eighth transistor is further connected to the output circuit. One end of the first capacitor is connected to the gate of the sixth transistor, and the other end is connected to the source of the sixth transistor.

In an embodiment, the fourth transistor, the fifth transistor, the sixth transistor, the seventh transistor and the eighth transistor are P-type thin film transistors.

In an embodiment, the output circuit includes a ninth transistor, a tenth transistor, a second capacitor and a third capacitor. A gate of the ninth transistor is connected to the source of the eighth transistor, a source of the ninth transistor is connected to the first power input terminal, and a drain of the ninth transistor is connected to a source of the tenth transistor. A gate of the tenth transistor is connected to the gate of the eighth transistor, and a drain of the tenth transistor is connected to the second power input terminal. One end of the second capacitor is connected to the gate of the ninth transistor, and the other end is connected to the source of the ninth transistor. One end of the third capacitor is connected to the gate of the tenth transistor, and the other end is connected to the third input terminal. An output signal generated by the output circuit is output from the source of the tenth transistor.

In an embodiment, the ninth transistor and the tenth transistor are P-type thin film transistors.

In an embodiment, the isolation circuit includes an eleventh transistor, a twelfth transistor and a thirteenth transistor. The eleventh transistor is connected between the source of the third transistor and the gate of the sixth transistor, a gate of the eleventh transistor is connected to the second power input terminal, a source of the eleventh transistor is connected to the source of the third transistor, and a drain of the eleventh transistor is connected to the gate of the sixth transistor. The twelfth transistor is connected between the gate of the fifth transistor and the gate of the sixth transistor, a gate of the twelfth transistor is connected to the second power input terminal, a drain of the twelfth transistor is connected to the gate of the fifth transistor, and a source of the twelfth transistor is connected to the gate of the sixth transistor. The thirteenth transistor is connected between the gate of the eighth transistor and the gate of the tenth transistor, a gate of the thirteenth transistor is connected to the second power input terminal, a drain of the thirteenth transistor is connected to the gate of the tenth transistor, and a source of the thirteenth transistor is connected to the gate of the eighth transistor.

In an embodiment, the eleventh transistor, the twelfth transistor and the thirteenth transistor are P-type thin film transistors.

In an embodiment, the isolation circuit includes a fourteenth transistor, a sixteenth transistor and a fifteenth transistor. The fourteenth transistor is connected between the gate of the second transistor and the gate of the tenth transistor, a gate of the fourteenth transistor is connected to the second power input terminal, a source of fourteenth transistor is connected to the gate of the second transistor, and a drain of the fourteenth transistor is connected to the gate of the tenth transistor. The sixteenth transistor is connected between the gate of the fifth transistor and the gate of the sixth transistor, a gate of the sixteenth transistor is connected to the second power input terminal, a drain of the sixteenth transistor is connected to the gate of the fifth transistor, and a source of the sixteenth transistor is connected to the gate of the sixth transistor. The fifteenth transistor is connected between the gate of the eighth transistor and the gate of the tenth transistor, a gate of the fifteenth transistor is connected to the second power input terminal, a drain of the fifteenth transistor is connected to the gate of the tenth transistor and the drain of the fourteenth transistor, and a source of the fifteenth transistor is connected to the gate of the eighth transistor.

In an embodiment, the fourteenth transistor, the sixteenth transistor and the fifteenth transistor are P-type thin film transistors.

In an embodiment, the first gate-controlled voltage is input to the gate of the sixth transistor, the second gate-controlled voltage is input to the gate of the ninth transistor; and the third gate-controlled voltage is input to the gate of the tenth transistor.

In an embodiment, the first gate voltage control circuit includes at least one transistor, one of the at least one transistor connects the first gate-controlled voltage or the third gate-controlled voltage; the second gate voltage control circuit includes at least two transistors, one of the at least two transistors connects the first gate-controlled voltage, another one of the at least two transistors connects the third gate-controlled voltage.

A second aspect of the present application provides an emission control driver, including at least two emission control driving circuits as described above. The at least two emission control driving circuits are connected sequentially, the first input terminal of the emission control driving circuit is connected to the output terminal of adjacent transmit control driving circuit.

In an embodiment, the first input terminal of each emission control driving circuit receives a start signal or an output signal of the emission control driving circuit. The second input terminal of an odd emission control driving circuit receives a first clock signal, and the third input terminal of the odd emission control driving circuit receives a second clock signal. The second input terminal of an even emission control driving circuit receives the second clock signal, and the third input terminal of the even emission control driving circuit receives the first clock signal.

In an embodiment, the first clock signal and the second clock signal have same transmission periods, and the first clock signal and the second clock signal have non-overlapping clock signals. When a second falling edge voltage of the first clock signal comes, the start signal changes to a rising edge voltage and maintains a high level voltage until a fourth falling edge voltage of the first clock signal comes.

A third aspect of the present application provides an organic light emitting display device, including the emission control driver as described above.

According to the emission control driving circuit, the emission control driver, and the organic light emitting display device provided by the embodiments of the present application, an isolation circuit is set between a second power input terminal and a first gate voltage control circuit and a second gate voltage control circuit. When a first gate-controlled voltage output by the first gate voltage control circuit is lower than a voltage of the second power input terminal, the isolation circuit can isolate the first gate voltage control node from the first gate voltage control circuit and/or the second gate voltage control circuit; or when a third gate-controlled voltage output by the second gate voltage control circuit is lower than the voltage of the second power input terminal, the isolation circuit can isolate the third gate voltage control node from the first gate voltage control circuit and/or the second gate voltage control circuit. Thereby preventing damage to the transistor in the first gate voltage control circuit and/or the second gate voltage control circuit caused by excessive voltage due to the first gate-controlled voltage or the third gate-controlled voltage being too low.

BRIEF DESCRIPTION OF DRAWINGS

FIG. 2b is an enlarged view of a repeating unit shown in the dashed box of FIG. 2a.

DESCRIPTIONS OF SYMBOLS

1—first emission control driving circuit (odd emission control driving circuit);
2—second emission control driving circuit (even emission control driving circuit);
10—first gate voltage control circuit;
11—first Input terminal;
12—second input terminal;
13—third input terminal;
20—second gate voltage control circuit;
30—output circuit; 31—output terminal;
100—pixel circuit;
200—scan driver;
300—data driver;
400—emissive control driving circuit.

DETAILED DESCRIPTION

In order to more clearly illustrate the purpose, technical solution and advantages of the present application, hereinafter, specific embodiments of the present application will be further described in detail with reference to the appended figures.

Figure 1:
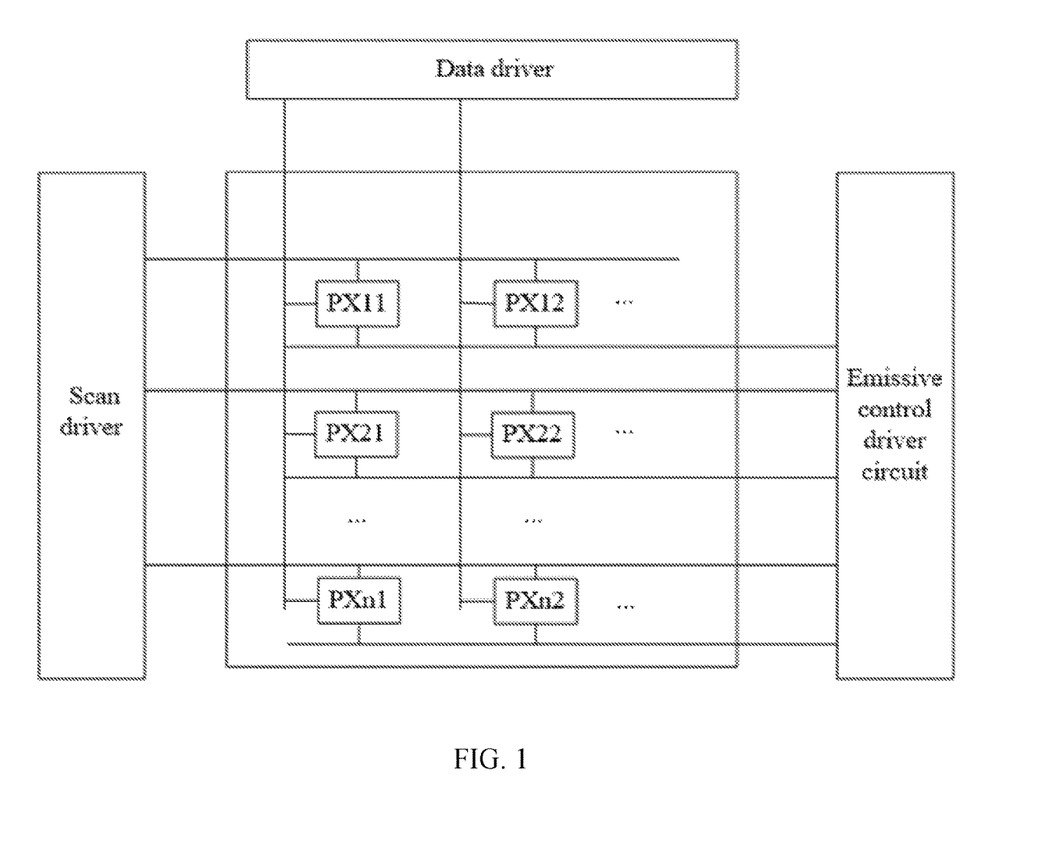
FIG. 1 is a schematic diagram of an organic light emitting display according to an embodiment of the present application.

FIG. 1 is a schematic diagram of an organic light emitting display according to an embodiment of the present application. As can be seen from the figure, the organic light emitting display device includes: a pixel circuit 100 formed by a plurality of pixels (PX11, PX12, ..., PXn1, PXn2) for displaying an image; a data driver 300 configured to apply a data voltage to the pixels; an scan driver 200 configured to sequentially apply an scan signal to the pixels; and an emission control driver 400 configured to apply an emission control signal to the pixels.

The pixels receive the data voltage in response to the scan signal, generates light having a predetermined brightness, corresponding to the data voltage, to display an image. The emission control driver 400 is initialized in response to an initial control signal and generates a transmission control signal to control transmission periods of the pixel.

Since the emission control driver needs a capacitor to maintain a voltage, the voltage across the capacitor has a bootstrap effect that causes the voltage across the capacitor to drop too fast. At this time, a transistor connected to the capacitor may have a large voltage drop between the gate and the source, which may cause the transistor breakdown damage. In order to solve the problems, the present application provides an emission control driver.

First of all, it should be noted that the marks EIN, ECK1, ECK2, VGH, VGL and EM1 in the figures herein may refer to either a terminal or a signal input by the corresponding terminal, which depends on the definition of the text portion. For example, a first clock signal terminal ECK1 refers to a terminal, a first clock signal ECK1 refers to a first clock signal and the first clock signal is input to the first clock signal terminal ECK1.

First Embodiment

Figure 2A:
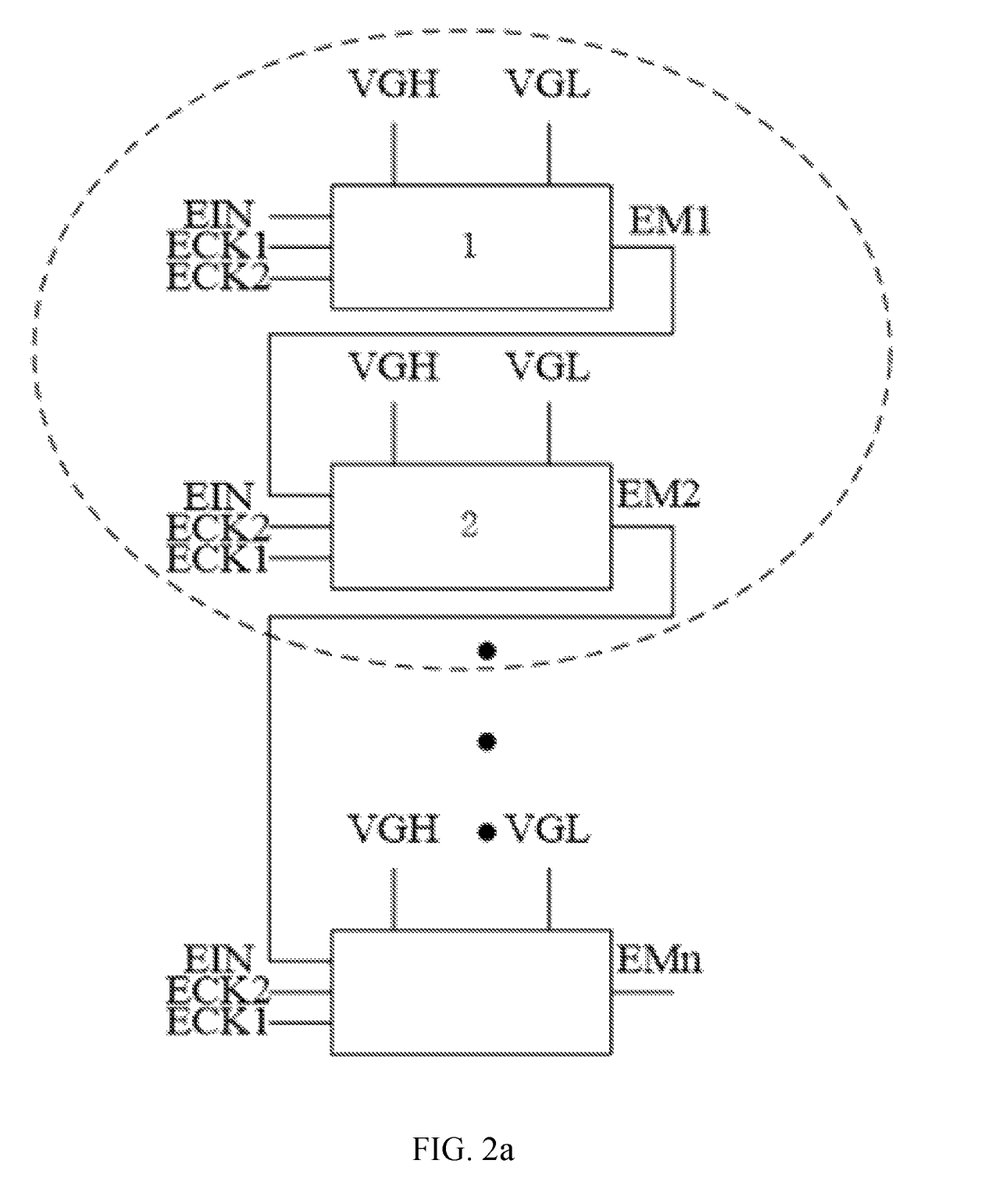
FIG. 2a is a schematic diagram of a transmission control driver according to an embodiment of the present application.

FIG. 2a is a schematic diagram of a transmission control driver according to an embodiment of the present application. As shown in FIG. 2a, the emission control driver includes a plurality of cascaded emission control driving circuits. Each of the emission control driving circuits includes a first power input terminal VGH, a second power input terminal VGL a first clock signal input terminal ECK1, a second clock signal input terminal ECK2, an input terminal EIN and an output terminal EMn (n=1, 2 ... ).

Figure 2B:
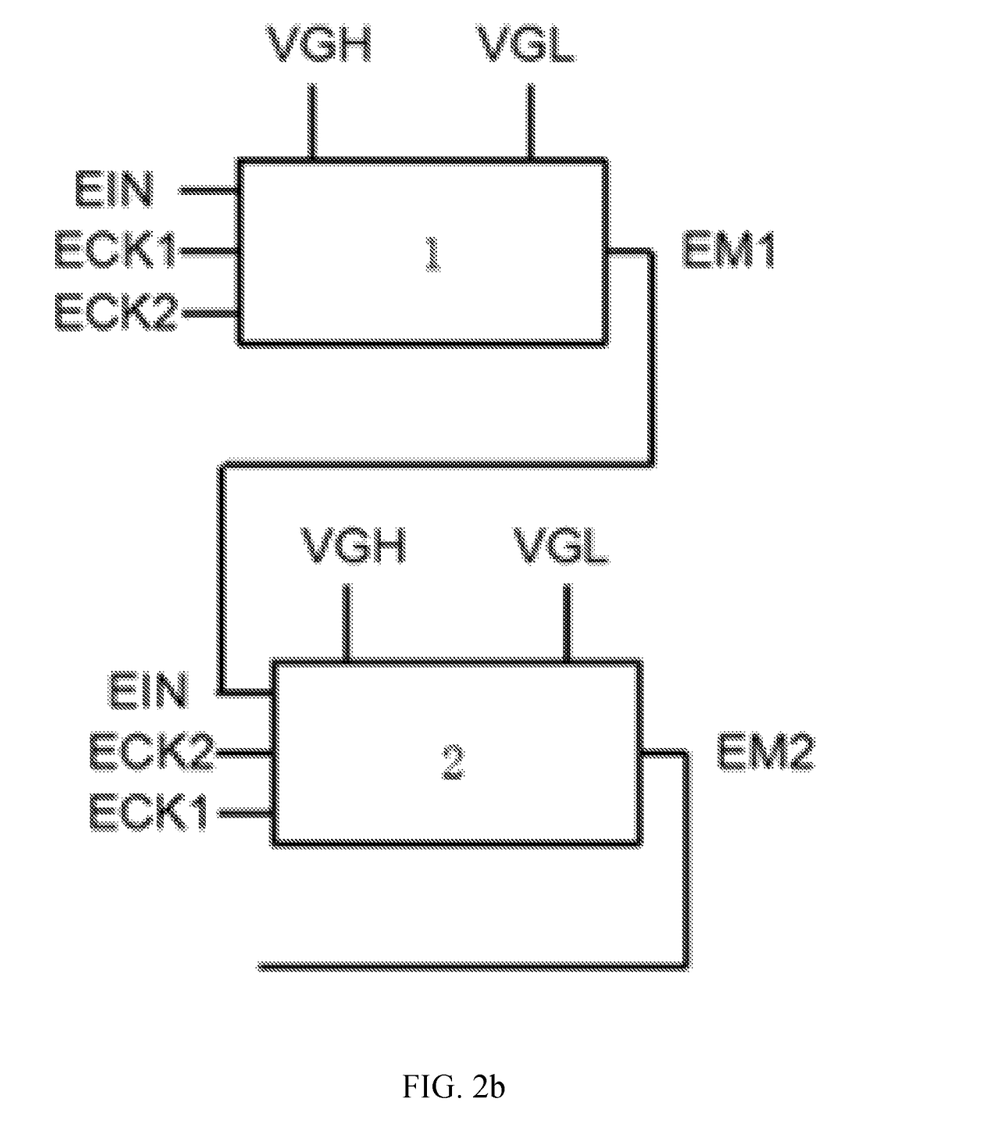

In order to more clearly describe the connection relationship of the plurality of emission control driving circuits in FIG. 2a, FIG. 2b is used for reference, that is an enlarged view of a repeating unit, or can be called into repeating circuit, shown in the dashed box of FIG. 2a. As shown in FIG. 2b, the repeating unit includes a first emission control driving circuit 1 and a second emission control driving circuit 2. The first emission control driving circuit 1 represents an odd emission control driving circuit, and the second emission control driving circuit 2 represents an even emission control driving circuit. An output terminal EM1 of the first emission control driving circuit 1 is connected to an input terminal EIN of the second emission control driving circuit 2. The transmission control driver 400 in FIG. 2a is finally formed by repeating the connection according to the structure of the first transmission control driving circuit 1 and the second transmission control driving circuit 2.

Figure 3:
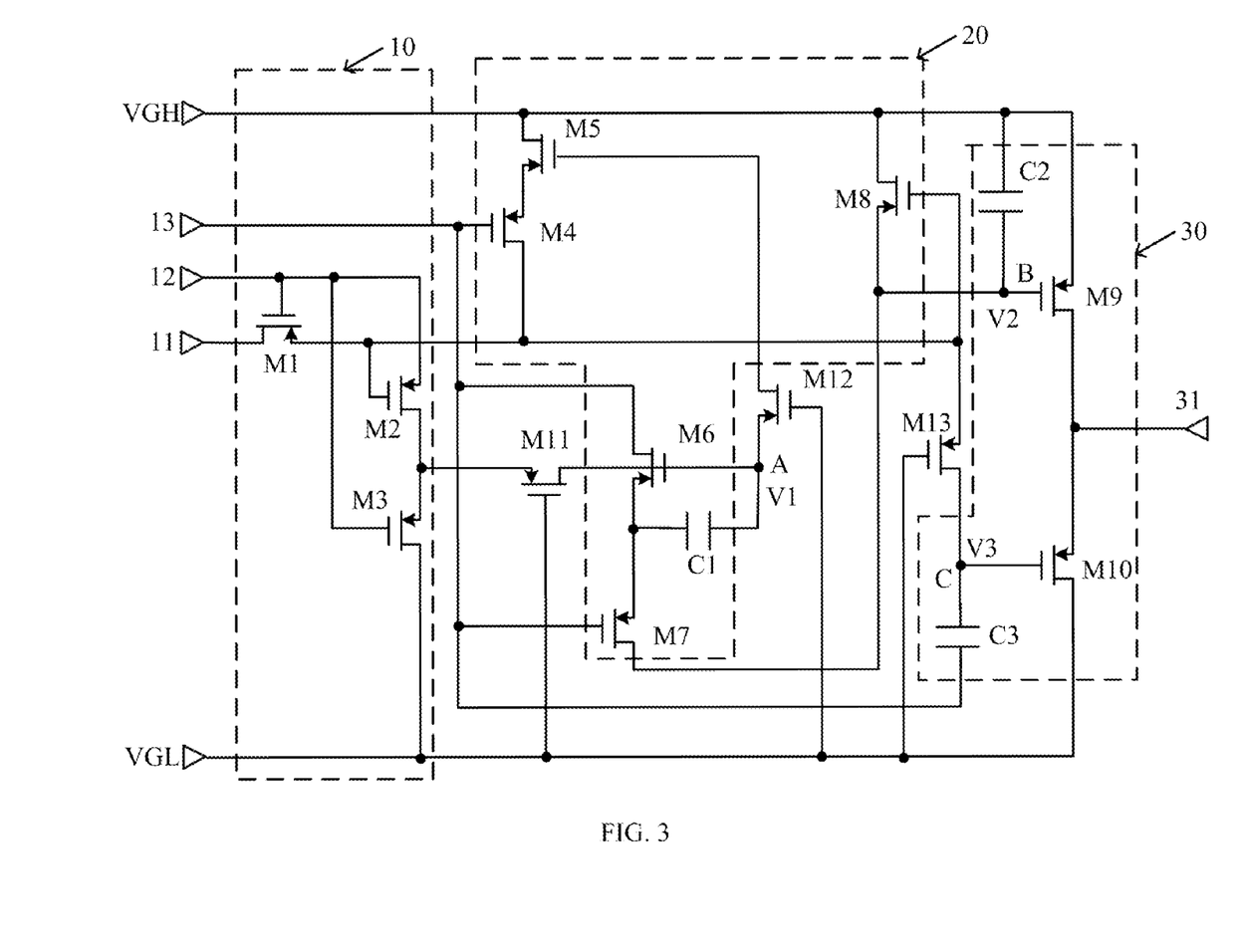
FIG. 3 is a schematic diagram of a transmission control driving circuit according to an embodiment of the present application.

FIG. 3 is a schematic diagram of a transmission control driving circuit according to an embodiment of the present application.

As shown in FIG. 3, the emission control driving circuit includes a first gate voltage control circuit 10, a second gate voltage control circuit 20, an output circuit 30, or can be called into output circuit 30 and an isolation circuit, or can be called into isolation circuit.

The first gate voltage control circuit 10 generates a first gate-controlled voltage V1 at a first gate voltage control node A according to signals of a first input terminal 11, a second input terminal 12 and a second power input terminal VGL. The second gate voltage control circuit 20 generates a second gate-controlled voltage V2 at a second gate voltage control node B and a third gate-controlled voltage V3 at a third gate voltage control node C according to the signals of the first gate-controlled voltage, the first input terminal 11, the second input terminal 12, a third input terminal 13, a first power input terminal VGH and the second power input terminal VGL. The output circuit 30 generates an output signal according to the signals of the second gate-controlled voltage V2, the third gate-controlled voltage V3, the first power input terminal VGH and the second power input terminal VGL. The isolation circuit is connected between the second power input terminal VGL and the first gate voltage control circuit 10 and the second gate voltage control circuit 20, i.e., the isolation circuit is respectively connected to the second power input terminal VGL, the first gate voltage control circuit 10 and the second gate voltage control circuit 20. When the first gate-controlled voltage V1 is lower than a voltage value of the second power input terminal VGL, the isolation circuit respectively isolates the first gate voltage control node. A from the first gate voltage control circuit 10 and the second gate voltage control circuit 20, i.e., a drain of a second transistor M2 is isolated from the first gate voltage control node A and a gate of the fifth transistor M5 is isolated from the first gate voltage control node A. Further, when a third gate-controlled voltage V3 is lower than the voltage value of the second power input terminal VGL, the isolation circuit isolates the third gate voltage control node C from the second gate voltage control circuit 20. i.e., a drain of the eighth transistor M8 is isolated from the third gate voltage control node C.

In one embodiment, the first gate voltage control circuit 10 and the second gate voltage control circuit 20 each includes a plurality of transistors. One transistor of the first gate voltage control circuit 10 is connected to the first gate voltage control node A, and two transistors of the second gate voltage control circuit 20 are respectively connected to the first gate voltage control node A and the third gate voltage control node C. Specifically, the transistor connected between the first gate voltage control circuit 10 and the first gate voltage control node A is the second transistor M2. The transistor connected between the second gate voltage control circuit 20 and the first gate voltage control node A is a fifth transistor M5. And the transistor connected between the second gate voltage control circuit 20 and the third gate voltage control node C is an eighth transistor M8. In this way, the isolation circuit can prevent the first gate-controlled voltage V1 from being too low to cause damage to the transistor (the second transistor M2, the fifth transistor M5 or the eighth transistor M8), which is connected to the first gate voltage control node A in the first gate voltage control circuit or in the second gate voltage control circuit.

Specifically, in the emission control driving circuit shown in FIG. 3, the first gate-controlled voltage control circuit 10 includes a first transistor M1, the second transistor M2 and a third transistor M3. The first transistor M1, the second transistor M2 and the third transistor M3 may be, for example, P-type thin film transistors. A gate of the first transistor M1 is connected to the second input terminal 12, a source of the first transistor M1 is connected to a gate of the second transistor M2, and a drain of the first transistor M1 is connected to the first input terminal 11. A source of the second transistor M2 is connected to the second input terminal 12, a drain of the second transistor M2 is connected to a source of the third transistor M3, and the gate of the second transistor M2 is further connected to the second gate voltage control circuit 20. A gate of the third transistor M3 is connected to the second input terminal 12, a drain of the third transistor M3 is connected to the second power input terminal VGL, and a source of the third transistor M3 is further connected to the second gate voltage control circuit 20.

In an embodiment, the first gate-controlled voltage control circuit 10 includes more than one second transistors M2, and these second transistors M2 are sequentially connected. Specifically, the gates of these second transistors M2 are all connected to the source of the first transistors M1, and the source of each second transistor M2 is connected to the drain of the adjacent second transistor M2. Thus, by the series connection of these second transistors, the leakage current between the source and the drain can be reduced after the transistor is turned off, and the reliability of turning off the transistor can be improved.

In the emission control driving circuit shown in FIG. 3, the second gate voltage control circuit 20 includes a fourth transistor M4, a fifth transistor M5, a sixth transistor M6, a seventh transistor M7, an eighth transistor M8 and a first capacitor C1. The fourth transistor M4, the fifth transistor M5, the sixth transistor M6, the seventh transistor M7, the eighth transistor M8 may be, for example, P-type thin film transistors. A gate of the fourth transistor M4 is connected to the third input terminal 13, a source of the fourth transistor M4 is connected to a source of the fifth transistor M5, and a drain of the fourth transistor M4 is connected to the gate of the second transistor M2. A gate of the fifth transistor M5 (sequentially through a drain or a source of M12 and a drain or a source of M11) is coupled to the source of the third transistor M3, and a drain of the fifth transistor M5 is connected to the first power input terminal VGH. A gate of the sixth transistor M6 is connected to the source of the third transistor M3, a source of the sixth transistor M6 is connected to a source of the seventh transistor M7, and a drain of the sixth transistor M6 is connected to the third input terminal 13. A gate of the seventh transistor M7 is connected to the third input terminal 13, and a drain of the seventh transistor M7 is connected to a source of the eighth transistor M8. A gate of the eighth transistor M8 is connected to the first input terminal 11 and the output circuit 30, a drain of the eighth transistor M8 is connected to the first power input terminal VGH, and the source of the eighth transistor M8 is further connected to the output circuit 30. One end of the first capacitor C1 is connected to the gate of the sixth transistor M6, and the other end of the first capacitor C1 is connected to the source of the sixth transistor M6.

In the emission control driving circuit shown in FIG. 3, the output circuit 30 includes a ninth transistor M9, a tenth transistor M10, a second capacitor C2 and a third capacitor C3. The ninth transistor M9 and the tenth transistor M10 may be, for example, P-type thin film transistors. A gate of the ninth transistor M9 is connected to the source of the eighth transistor M8, a source of the ninth transistor M9 is connected to the first power input terminal VGH, and a drain of the ninth transistor M9 is connected to the source of the tenth transistor M10. A gate of the tenth transistor M10 is connected to the gate of the eighth transistor M8, a source of the tenth transistor M10 is connected to the output terminal 31, and a drain of the tenth transistor M10 is connected to the second power input terminal VGL. One end of the second capacitor C2 is connected to the gate of the ninth transistor M9, and the other end of the second capacitor C2 is connected to the source of the ninth transistor M9. One end of the third capacitor C3 is connected to the gate of the tenth transistor M10, and the other end of the third capacitor C3 is connected to the third power input terminal 13. An output signal generated by the output circuit 30 is output from the output terminal 31.

In the emission control driving circuit shown in FIG. 3, the isolation circuit comprises an eleventh transistor M11, a twelfth transistor M12 and a thirteenth transistor M13. The eleventh transistor M11, the twelfth transistor M12 and the thirteenth transistor M13 may be, for example, P-type thin film transistors. The eleventh transistor M11 is connected between the source of the third transistor M3 and the gate of the sixth transistor M6, a gate of the eleventh transistor M11 is connected to the second power input terminal VGL, a source of the eleventh transistor M11 is connected to the source of the third transistor M3, and a drain of the eleventh transistor M11 is connected to the gate of the sixth transistor M6. The twelfth transistor M12 is connected between the gate of the fifth transistor M5 and the gate of the sixth transistor M6, a gate of the twelfth transistor M12 is connected to the second power input terminal VGL, and a drain of the twelfth transistor M12 is connected to the gate of the fifth transistor M5, and a source of the twelfth transistor M12 is connected to the gate of the sixth transistor M6. The thirteenth transistor M13 is connected between the gate of the eighth transistor M8 and the gate of the tenth transistor M10, a gate of the thirteenth transistor M13 is connected to the second power input terminal VGL, and a drain of the thirteenth transistor M13 is connected to the gate of the tenth transistor M10, a source of the thirteenth transistor M13 is connected to the gate of the eighth transistor M8.

For the emission control driving circuit shown in FIG. 3, the first gate-controlled voltage V1 is input to the gate of the sixth transistor M6; the second gate-controlled voltage V2 is input to the gate of the ninth transistor M9; and the third gate-controlled voltage V3 is input to the gate of the tenth transistor M10.

Figure 4:
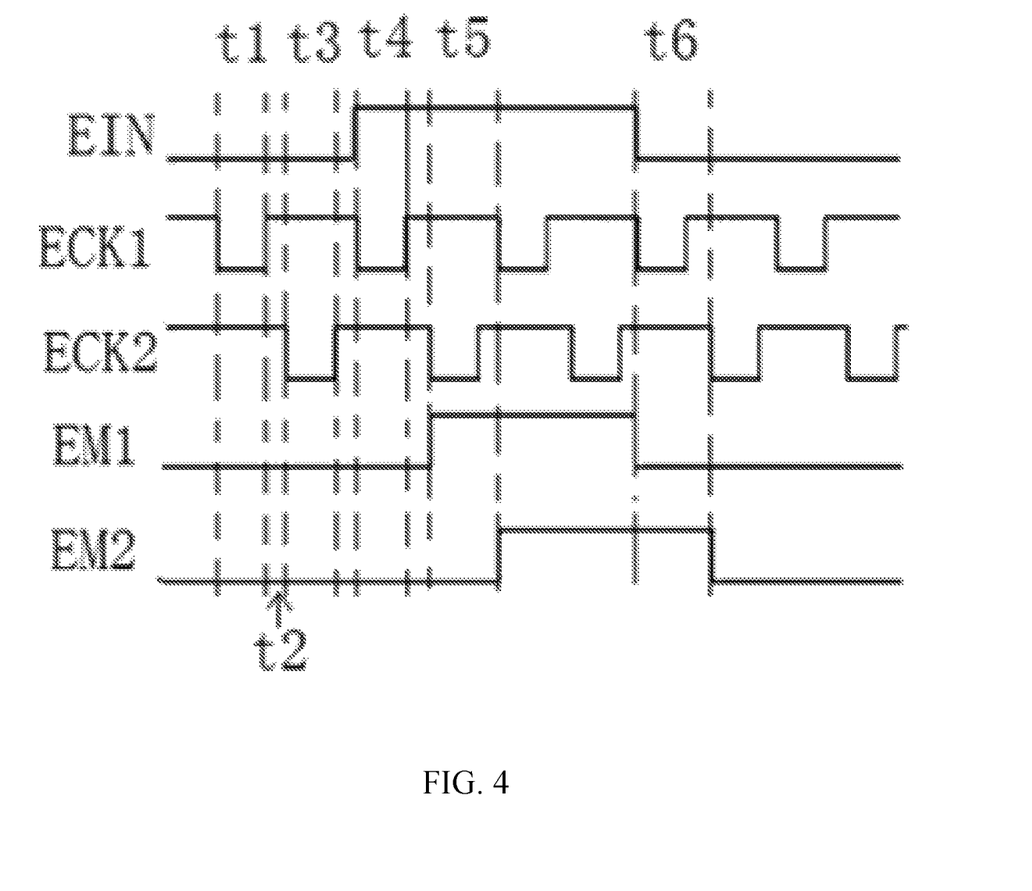
FIG. 4 is a waveform diagram of a signal of the transmission control driving circuit according to another embodiment of the present application.

When the emission control driving circuit shown in FIG. 3 is applied to the emission control driver shown in FIG. 2a, in the emission control driving circuit, the first input terminal 11 receives an output signal of the previous emission control driving circuit. For example, as shown in FIG. 2b, the first input terminal 11 of the second emission control driving circuit 2 is connected to the output terminal 31 of the first emission control driving circuit 1, so as to receive the output signal EM1 of the first emission control driving circuit 1, and a waveform of the output signal EM1 is shown in FIG. 4. The first input terminal 11 of the first emission control driving circuit 1 receives the start signal EIN, and a waveform of the start signal EIN is shown in FIG. 4. An odd emission control driving circuit, for example, the second input terminal 12 of the first emission control driving circuit 1 receives a first clock signal ECK1, and the odd emission control driving circuit, for example, the third input terminal 13 of the first emission control driving circuit 1 receives a second clock signals ECK2. An even emission control driving circuit, for example, the second input terminal 12 of the second emission control driving circuit 2 receives the second clock signal ECK2, and the even emission control driving circuit, for example, the third input terminal 13 of the second emission control driving circuit 2 receives the first clock signal ECK1. The waveforms of the first clock signal ECK1 and the second clock signal ECK2 are as shown in FIG. 4.

Further, transmission periods of the first clock signal ECK1 and the second clock signal ECK2 are the same, and the phases of the first clock signal and the second clock signal are non-overlapping. As shown in FIG. 4, when a second falling edge voltage of the first clock signal ECK1 comes, the start signal EIN changes to a rising edge voltage and maintains a high level voltage until a fourth falling edge voltage of the first clock signal ECK1 comes. A voltage value of the first power input terminal VGH is higher than a voltage value of the second power input terminal VGL.

The embodiment of the present application also provides an emission control driver, including a plurality of the above-mentioned emission control drive circuits, and the plurality of the emission control drive circuits are connected sequentially, the first input terminal of a latter emission control drive circuit is connected to the output terminal of a former emission control driving circuit adjacent to the latter emission control driving circuit.

The embodiment of the present application also provides an organic light emitting display device, including the emission control driver as described above.

In the emission control drive circuit and the organic light emitting display device provided by the embodiments of the present application, when the first gate-controlled voltage V1 is lower than the voltage value of the second power input terminal VGL, the isolation circuit respectively isolates the first gate voltage control node A from the first gate voltage control circuit 10 and the second gate voltage control circuit 20, which can prevent the first gate-controlled voltage V1 from being too low to cause damage to the transistor (the second transistor M2 and the fifth transistor M5) in the first gate voltage control circuit or in the second gate voltage control circuit. When the third gate-controlled voltage V3 is lower than the voltage value of the second power input terminal VGL, the isolation circuit isolates the third gate voltage control node C from the second gate voltage control circuit 20 (when the third gate-controlled voltage V3 is lower than the voltage value of the second power input terminal VGL, the gale voltage of the thirteenth transistor M13 is greater than the source voltage of the thirteenth transistor M13, the thirteenth transistor M13 is turned off, so as to isolate the third gate voltage control node C from the gate of the eighth transistor), which can prevent the third gate-controlled voltage V3 from being too low to cause damage to the transistor (the eighth transistor M8) in the second gate voltage control circuit 20.

In addition, the isolation circuit includes the eleventh transistor M11, the twelfth transistor M12 and the thirteenth transistor M13. The eleventh transistor M11, the twelfth transistor M12 and the thirteenth transistor M13 are all P-type thin film transistors, and the gates of the eleventh transistor M11, the twelfth transistor M12 and the thirteenth transistor M13 are connected to the second power input VGL. When the source voltage and the drain voltage of the eleventh transistor M11, the twelfth transistor M12 and the thirteenth transistor M13 are not too low, the eleventh transistor M11, the twelfth transistor M12 and the thirteenth transistor M13 are automatically turned on. When the source voltage or the drain voltage of the eleventh transistor M11, the twelfth transistor M12 and the thirteenth transistor M13 is too low (below the second power input terminal VGL), the eleventh transistor M11, the twelfth transistor M12 and the thirteenth transistor M13 is automatically turned off to isolate the source and drain.

In the embodiment of the present application, a timing waveform of the first emission control driving circuit is analyzed. As shown in FIG. 4, the start signal EIN and the first clock signal ECK1 are at a low level in a first transmission period t1, and the second clock signal ECK2 is at a high level at a first transmission period t1. The eleventh transistor M11, the twelfth transistor M12 and the thirteenth transistor M13 are all P-type thin film transistors, and the gate of which are all connected to the second power input terminal. Therefore, in the normal case of the following analysis, the eleventh transistor M11, the twelfth transistor M12 and the thirteenth transistor M13 are equivalent to a conductive wire and will not be described herein.

The first clock signal ECK1 with the low level is applied to the gate of the first transistor M1 and the gate of the third transistor M3. Therefore, the first transistor M1 and the third transistor M3 are turned on.

The start signal EIN with the low level is applied to the gate of the second transistor M2 and the third gate voltage control node C through the turned-on first transistor M1. Therefore, the second transistor M2 is turned on, and the third gate-controlled voltage V3 is at the low level.

The first clock signal ECK1 with the low level and the second power input terminal VGL are applied to the first gate voltage control node A respectively through the turned-on second transistor M2 and the turned-on third transistor M3. Therefore, the first gate-controlled voltage V1 at the first gate voltage control node A is set to the low level.

The second clock signal ECK2 with the high level is applied to the fourth transistor M4 and the seventh transistor M7. Therefore, the fourth transistor M4 and the seventh transistor M7 are turned off.

Since the third gate-controlled voltage V3 is at the low level, the eighth transistor M8 is turned on. The voltage of the first power input terminal VGH is applied to the second gate voltage control node B through the turned-on eighth transistor M8. Therefore, the second gate-controlled voltage V2 is set to the high level. The second capacitor C2 is charged with the first power input terminal VGH. In other words, the second capacitor C2 is charged with a voltage having the high level. Since the second gate-controlled voltage V2 is at the high level, the ninth transistor M9 is turned off.

Since the third gate-controlled voltage V3 is at the low level, the tenth transistor M10 is turned on. Due to the turned-on tenth transistor M10, the voltage of the second power input terminal VGL is applied to a first emission control line EM1, and therefore, the output signal EM1 of the first emission control driving circuit is at the low level.

In a second transmission period t2, the start signal EIN is at the low level, the first clock signal ECK1 and the second clock signal ECK2 are at the high level. The first transistor M1 and the third transistor M3 are turned off through the first clock signal ECK1 with the high level.

Since the third gate-controlled voltage V3 remains at the low level, the second transistor M2 is turned on. The first clock signal ECK1 with the high level is applied to the first gate voltage control node A through the turned-on second transistor M2. Therefore, the first gate-controlled voltage V1 is at the high level.

The third gate-controlled voltage V3 is at the low level, and therefore, the eighth transistor M8 and the tenth transistor M10 are turned on. The first power input terminal VGH is applied to the second gate voltage control node B through the turned-on eighth transistor M8, so that the second gate-controlled voltage V2 is maintained at the high level.

Since the second gate-controlled voltage V2 is at the high level and the third gate-controlled voltage V3 is at the low level, the ninth transistor M9 is turned off and the tenth transistor M10 is turned on. So that the first emission control signal EM1 remains at the low level.

In a third transmission period t3, the second clock signal ECK2 changes from the high level to the low level, and then changes from the low level to the high level again. Therefore, the third gate-controlled voltage V3 is bootstrapped by the change of an electric potential of the second clock signal ECK2, due to a coupling of the third capacitor C3. When the second clock signal ECK2 in the second transmission period is at the high level, the third gate-controlled voltage V3 is still at the low level; when the second clock signal ECK2 at the third time point changes from the high level to the low level, the level of the third gate-controlled voltage V3 further reduced and be even lower than the voltage of the second power input terminal VGL because of the coupling of the third capacitor C3 (bootstrap effect). At this time, for the eighth transistor M8, the gate voltage is much lower than the source voltage (the drain of the eighth transistor M8 is connected to the first power input terminal VGH, and at this time the eighth transistor M8 is turned on, a voltage of the source is also at the high level). When the gate of the eighth transistor M8 is directly connected to the third gate voltage control node C, breakdown damage may occur. In order to avoid this risk, the present embodiment adds the thirteenth transistor M13. At this time, the drain of the thirteenth transistor M13 is connected to the third gate voltage control node C, the gate of the thirteenth transistor M13 is connected to the second power input terminal VGH, since the third gate-controlled voltage V3 is lower than the second power input terminal VGL, the thirteenth transistor M13 is quickly turned off, so that the eighth transistor M8 is isolated from the third gate voltage control node C to prevent the eighth transistor M8 from being damaged. The source of the tenth transistor M10 (at this time the tenth transistor M10 is turned on) is connected to the second power input terminal VGL and is at the low level, so a voltage difference between the gate and the source of the tenth transistor M10 is small, the tenth transistor M10 will not be damaged and continues to be turned on, thereby the first emission control signal is kept at the low level.

At a fourth transmission point t4, the start signal EIN and the second clock signal ECK2 are at the high level, and the first clock signal ECK1 is at the low level. At this time, the second clock signal ECK2 ends at the low level turns to the high level. The bootstrap effect is stopped by the voltage increase of the one end of the third capacitor C3 connected to the third input terminal 13; and the third capacitor C3 stops the coupling process. The third gate-controlled voltage V3 changes to the high level of the second power input terminal VGL from the low level, and the thirteenth transistor M13 maintains conduction.

The first transistor M1 is turned on by the first clock signal ECK1 with the low level; and the start signal EIN with the high level is applied to the third gate voltage control node C; and the third gate-controlled voltage V3 is at the high level. Therefore, the second transistor M2 and the tenth transistor M10 are turned off.

The third transistor M3 is turned on in response to the first clock signal ECK1 with the low level and the second power input terminal VGL is applied to the node with the first gate-controlled voltage V1. Therefore, the first gate-controlled voltage V1 is at the low level.

The seventh transistor M7 is turned off in response to the second clock signal ECK2 with the high level. Since the third gate-controlled voltage V3 is at the high level, the eighth transistor M8 is turned off. The second gate-controlled voltage V2 is maintained at the high level by the charging effect of the second capacitor C2. The second gate-controlled voltage V2 is maintained at the high level, and therefore the ninth transistor M9 is turned off. Therefore, the first emission control signal is maintained at the low level.

At a fifth transmission point t5. The start signal EN and the first clock signal ECM are at the high level, and the second clock signal ECK2 is at the low level.

The first transistor M1 and the third transistor M3 are turned off by the first clock signal ECK1 with the high level. Since the third gate-controlled voltage V3 is maintained at the high level, the second transistor M2, the eighth transistor M8 and the tenth transistor M10 are turned off.

The fourth transistor M4 and the seventh transistor M7 are turned on in response to the second clock signal ECK2 having the low level. In addition, the first gate-controlled voltage V1 is set to the low level, so that the fifth transistor M5 and the sixth transistor M6 are turned on.

As the above-mentioned bootstrapped, because of the coupling of the first capacitor C1, the first gate-controlled voltage V1 is bootstrapped by the change of the electric potential of the second clock signal ECK2. I.e., when the second clock signal ECK2 is at the high level at the fourth time point t4, the first gate-controlled voltage V1 is still at the low level. When the second clock signal ECK2 changes from the high level to the low level at the fifth transmission point t5, the first gate-controlled voltage V1 is further reduced and even lower the voltage of the second power input terminal VGL because of the coupling (bootstrap effect) of the first capacitor C1. At this time, for the second transistor M2, when the drain of the second transistor M2 is directly connected to the first gate voltage control node A, the gate voltage of the second transistor M2 (the start signal EIN is at the high level) is much higher than the drain voltage of the second transistor M2, which may cause breakdown. In order to avoid this risk, the present embodiment of the prevent application adds the eleventh transistor M11. At this time, the drain of the eleventh transistor M11 is connected to the first gate voltage control node A, the gate of the eleventh transistor M11 is connected to the second power input terminal VGL, and since the first gate-controlled voltage V1 is lower than the voltage of the second power input terminal VGL, the eleventh transistor M11 is quickly turned off, so that the second transistor M2 is isolated from the first gate voltage control node A to prevent the second transistor M2 from being damaged. Similarly, the large decrease of the first gate-controlled voltage V1 also affects the fifth transistor M5. When the gate of the fifth transistor M5 is directly connected to the first gate voltage control node A, and the drain of the fifth transistor M5 is connected to the first power input terminal VGH (a reference voltage of the present application is that the first power input terminal VGH is at the high level, about 7V, and since the fifth transistor M5 is turned on, the source of the fifth transistor M5 is also kept at about 7V, the gate the fifth transistor M5 is at about −17.2V, and the voltage between the gate and the source is 24.2V), then the gate source voltage being too large will cause breakdown damage. In order to avoid this risk, the present embodiment adds the twelfth transistor M12. At this time, the drain of the twelfth transistor M12 is connected to the first gate voltage control node A, the gate of the twelfth transistor M12 is connected to the second power input terminal VGL, and since the first gate-controlled voltage V1 is lower than the voltage of the second power input terminal VGL, the twelfth transistor M12 is quickly turned off, so that the fifth transistor M5 is isolated from the first gate voltage control node A (after isolation, the gate voltage of the fifth transistor M5 is −5.3V, and the voltage between the gate and the source is reduced from 24.2V to 12.3V). The risk of a gate insulation breakdown by the high voltage is greatly reduced to prevent the fifth transistor M5 from being damaged.

The second clock signal ECK2 with the low level is applied to the second gate voltage control node B through the turned-on sixth transistor M6 and seventh transistor M7. Therefore, the second gate-controlled voltage V2 is at the low level at the fifth transmission point t5. Since the second gate-controlled voltage V2 is at the low level, the ninth transistor M9 is turned on.

The ninth transistor M9 is turned on and the tenth transistor M10 is turned off, so that the first emission control signal is maintained at the high level.

At the sixth transmission point t6, the start signal EIN and the first clock signal ECK1 are at the low level, and the second clock signal ECK2 is at the high level. According to the operation at the first transmission point t1, the first emission control signal is set to the low level at the sixth transmission point t6.

In the embodiment, the first to ninth transistors M1-M9 are all P-type thin film transistors. In other embodiments, the first to ninth transistors M1-M9 may also be N-type thin film transistor. The P-type thin film transistors is turned on when the gate signal is at the low level, and the N-type thin film transistor is turned on when the gate signal is at the high level. Therefore, it is only necessary to match a selected transistor type with a turned-on electric potential.

Second Embodiment

Figure 5:
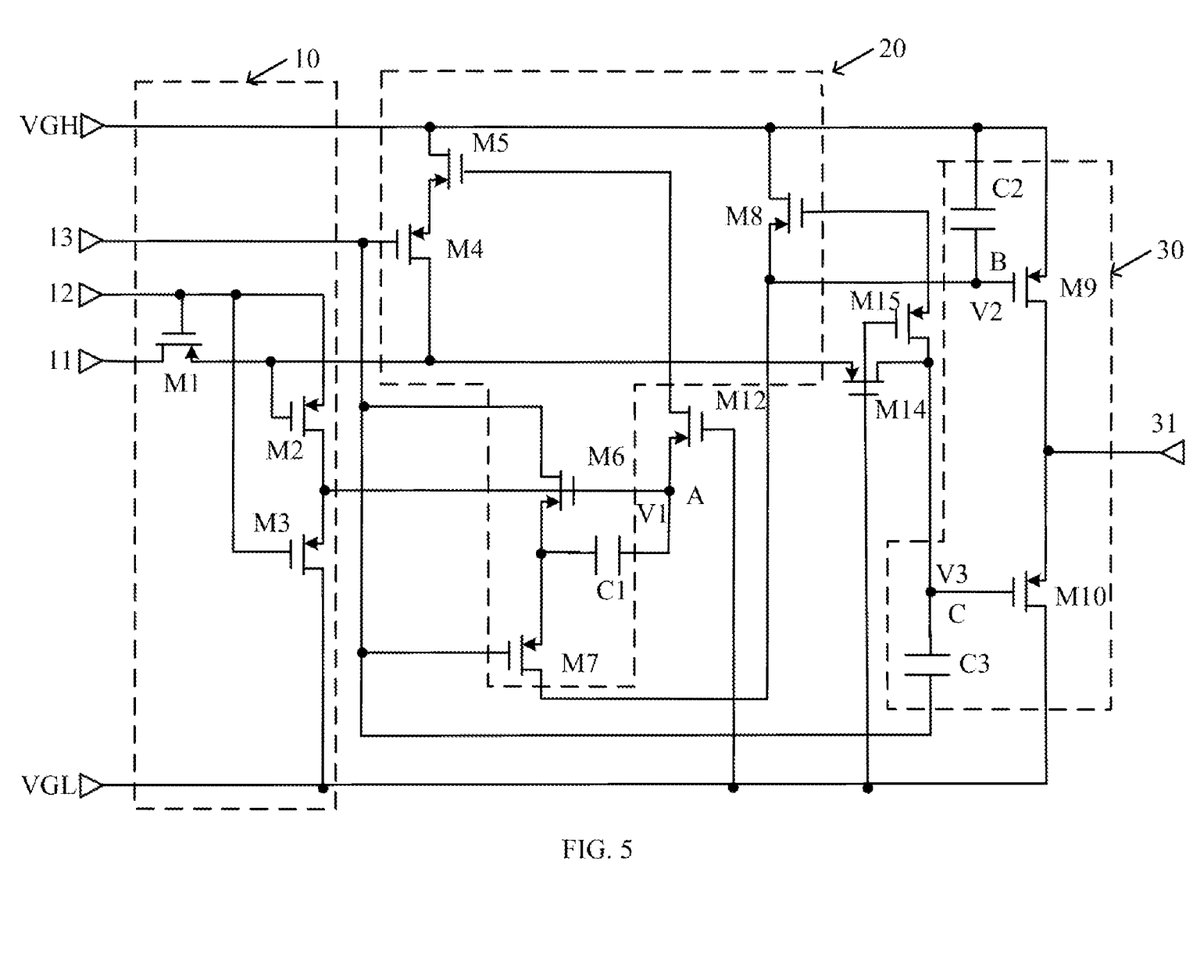
FIG. 5 is a schematic diagram of a transmission control driving circuit according to another embodiment of the present application.

In the embodiment, as shown in FIG. 5, the structures of the first gate voltage control circuit, the second gate voltage control circuit, and the output circuit are the same as described in the above-mentioned embodiment. The difference is that the isolation circuit is connected between the second power input terminal VGL and the first gate voltage control circuit 10 and the second gate voltage control circuit 20. When the first gate-controlled voltage V1 is lower than the voltage value of the second power input terminal VGL, the isolation circuit isolates the first gate voltage control node A from the second gate voltage control circuit 20, i.e., the gate of the fifth transistor M5 is isolated from the first gate-controlled voltage V1. When the third gate-controlled voltage V3 is lower than the voltage value of the second power input terminal VGL, the isolation circuit isolates the third gate voltage control node C from the first gate voltage control circuit 10 and the second gate voltage control circuit 20, i.e., the source of the second transistor M2 is isolated from the third gate voltage control node C and the drain of the eighth transistor M8 is isolated from the third gate voltage control node C.

Specifically, the isolation circuit includes a fourteenth transistor M14, a sixteenth transistor M16 and a fifteenth transistor M15. The fourteenth transistor M14, the sixteenth transistor M16 and the fifteenth transistor M15 are P-type thin film transistors. The fourteenth transistor M14 is connected between the gate of the second transistor M2 and the gate of the tenth transistor M10, a gate of the fourteenth transistor M14 is connected to the second power input terminal VGL, a source of the fourteenth transistor M14 is connect to the gate of the second transistor M2, and a drain of the fourteenth transistor M14 is connected to the gate of the tenth transistor M10. The structure and connection relationship of the sixteenth transistor M16 are the same as in the previous embodiment. The sixteenth transistor M16 is connected between the gate of the fifth transistor M5 and the gate of the sixth transistor M6, a gate of the sixteenth transistor M16 is connected to the second power input terminal VGL a drain of the sixteenth transistor M16 is connected to the gate of the fifth transistor M5, and a source of the sixteenth transistor M16 is connected to the gate of the sixth transistor. The fifteenth transistor M15 is connected between the gate of the eighth transistor M8 and the gate of the tenth transistor M10, a gate of the fifteenth transistor M15 is connected to the second power input terminal VGL, a drain of the fifteenth transistor M15 is connected to the gate of the tenth transistor M10 and the drain of the fourteenth transistor M14, and a source of the fifteenth transistor M15 is connected to the gate of the eighth transistor M8.

In addition, since the isolation circuit includes the fourteenth transistor M14, the sixteenth transistor M16 and the fifteenth transistor M15, which are all P-type thin film transistors, and the gates of the fourteenth transistor M14, the sixteenth transistor M16 and the fifteenth transistor M15 are connected to the second power input VGL. When the voltages between the source and the drain of the fourteenth transistor M14, the sixteenth transistor M16 and the fifteenth transistor M15 are not too low, the fourteenth transistor M14, the sixteenth transistor M16 and the fifteenth transistor M15 are automatically turned on. When the voltages between the source and the drain of the fourteenth transistor M14, the sixteenth transistor M16 and the fifteenth transistor M15 are too low (below the second power input terminal VGL), the fourteenth transistor M14, the sixteenth transistor M16 and the fifteenth transistor M15 are automatically turned off to isolate the source and drain.

In the embodiment of the present application, a timing waveform of the first emission control driving circuit is analyzed. As shown in FIG. 4, the start signal EIN and the first clock signal ECK1 are at a low level at a first time point t1, and the second clock signal ECK2 is at a high level in a first transmission period t1. The fourteenth transistor M14, the sixteenth transistor M16 and the fifteenth transistor M15 are all P-type thin film transistors, and the gates of those are connected to the second power input terminal VGL. Therefore, in the normal case of the following analysis, the fourteenth transistor M14, the sixteenth transistor M16 and the fifteenth transistor M15 are equivalent to a conductive wire and will not be described herein.

The first clock signal ECK1 with the low level is applied to the gate of the first transistor M1 and the gate 1 of the third transistor M3. Therefore, the first transistor M1 and the third transistor M3 are turned on.

The start signal EIN with the low level is applied to the gate of the second transistor M2 and the third gate voltage control node C through the turned-on first transistor M1. Therefore, the second transistor M2 is turned on, and the third gate-controlled voltage V3 is at the low level.

The first clock signal ECK1 with the low level and the voltage of the second power input terminal VGL are applied to the first gate voltage control node A respectively through the turned-on second transistor M2 and the turned-on third transistor M3. Therefore, the first gate-controlled voltage V1 is at the low level.

The second clock signal ECK2 with the high level is applied to the fourth transistor M4 and the seventh transistor M7. Therefore, the fourth transistor M4 and the seventh transistor M7 are turned off.

Since the third gate-controlled voltage V3 is at the low level, the eighth transistor M8 is turned on. The first power input terminal VGH is applied to the second gate voltage control node B through the turned-on eighth transistor M8. Therefore, the second gate-controlled voltage V2 is at the high level. The second capacitor C2 is charged with the first power input terminal VGH. In other words, the second capacitor C2 is charged with a voltage having the high level. Since the second gate-controlled voltage V2 is at the high level, the ninth transistor M9 is turned off.

Since the third gate-controlled voltage V3 is at the low level, the tenth transistor M10 is turned on. Due to the turned-on tenth transistor M10, a voltage of the second power input terminal VGL is applied to a first emission control line EM1, and therefore, the output signal EM1 of the first emission control driving circuit has the low level.

At a second transmission point t2, the start signal EIN is at the low level, and the first clock signal ECK1 and the second clock signal ECK2 are at the high level. The first transistor M1 and the third transistor M3 are turned off through the first clock signal ECK1 with the high level.

Since the third gate-controlled voltage V3 is maintained at the low level, the second transistor is turned on. The first clock signal ECK1 with the high level is applied to the first gate voltage control node A. Therefore, the first gate-controlled voltage V1 is at the high level.

The third gate-controlled voltage V3 is at the low level, and therefore, the eighth transistor M8 and the tenth transistor M10 are turned on. The voltage of the first power input terminal VGH is applied to the second gate voltage control node B through the turned-on eighth transistor M8, so that the second gate-controlled voltage V2 is maintained at the high level.

Since the second gate-controlled voltage V2 is at the high level and the third gate-controlled voltage V3 is at the low level, the ninth transistor M9 is turned off and the tenth transistor M10 is turned on. Therefore, the first emission control signal is maintained at the high level.

At a third transmission point t3, the second clock signal ECK2 changes from the high level to the low level, and then changes from the low level to the high level again. Therefore, because of a coupling of the third capacitor C3, the third gate-controlled voltage V3 is bootstrapped by the change of an electric potential of the second clock signal ECK2. I.e., when the second clock signal ECK2 in the second transmission period is at the high level, the third gate-controlled voltage V3 is still at the low level; and when the second clock signal ECK2 in the third transmission period changes from the high level to the low level, the third gate-controlled voltage V3 further reduced and be even lower than the voltage of the second power input terminal VGL because of the coupling of the third capacitor C3 (bootstrap effect). At this time, for the second transistor M2, the gate voltage is much lower than the source voltage (the drain of the second transistor M2 is connected to the second input terminal 12, and the first clock signal ECK1 is at the high level). When the gate of the second transistor M2 is directly connected to the third gate voltage control node C, breakdown damage may occur. In order to avoid this risk, the present embodiment adds the fourteenth transistor M14. At this time, the drain of the fourteenth transistor M14 is connected to the third gate voltage control node C, the gate of the fourteenth transistor M14 is connected to the second power input terminal VGL, and since the third gate-controlled voltage V3 is lower than the voltage at the second power input terminal VGL, the fourteenth transistor M14 is quickly turned off, so that the second transistor M2 is isolated from the third gate voltage control node C to prevent the second transistor M2 from being damaged. Similarly, for the eighth transistor M8, the gate voltage is much lower than the source voltage (the drain of the eighth transistor M8 is connected to the first power input terminal VGH, at this time the eighth transistor M8 is turned on, and a voltage of the source is also at the high level). When the gate of the eighth transistor M8 is directly connected to the third gate voltage control node C, breakdown damage may occur. In order to avoid this risk, the present embodiment adds the fifteenth transistor M15. At this time, the drain of the fifteenth transistor M15 is connected to the third gate voltage control node C, the gate of the fifteenth transistor M15 is connected to the second power input terminal VGL, and since the third gate-controlled voltage V3 is lower than the voltage at the second power input terminal VGL, the fifteenth transistor M15 is quickly turned off, so that the eighth transistor M8 is isolated from the third gate voltage control node C to prevent the eighth transistor M8 from being damaged. Since the source of the tenth transistor M10 (when the tenth transistor M10 is turned on) is connected to the second power input terminal VGL and is the low level, a voltage difference between the gate and the source of the tenth transistor M10 is small and the tenth transistor M10 will not be damaged and continues to be turned on, thereby the first emission control signal is kept at the low level.

In a fourth transmission period t4, the start signal EIN and the second clock signal ECK2 are at the high level, and the first clock signal ECK1 is at the low level. At this time, the second clock signal ECK2 ends at the low level and changes to the high level. The bootstrap effect is stopped by the voltage increase of the one end of the third capacitor C3 connected to the third input terminal I3; and the third capacitor C3 stops the coupling process. The third gate-controlled voltage V3 changes to the high level of the second power input terminal VGL from the low level, the fourteenth transistor M14 and the fifteenth transistor M15 maintain conduction.

The first transistor M1 is turned on by the first clock signal ECK1 with the low level; and the start signal EIN with the high level is applied to the third gate voltage control node C; and the third gate-controlled voltage V3 is at the high level. Therefore, the second transistor M2 and the tenth transistor M10 are turned off.

The third transistor M3 is turned on in response to the first clock signal ECK1 with the low level, and the voltage of the second power input terminal VGL is applied to the first gate-controlled voltage V1. Therefore, the first gate-controlled voltage V1 is at the low level.

The seventh transistor M7 is turned off in response to the second clock signal ECK2 having the high level. Since the third gate-controlled voltage V3 is at the high level, the eighth transistor M8 is turned off. The second gate-controlled voltage V2 is maintained at the high level by the charging effect of the second capacitor C2. The second gate-controlled voltage V2 is maintained at the high level, and therefore the ninth transistor M9 is turned off. Therefore, the first emission control signal is kept at the low level.

In a fifth transmission period t5, the start signal EIN and the first clock signal ECK1 are at the high level, and the second clock signal ECK2 is at the low level.

The first transistor M1 and the third transistor M3 are turned off by the first clock signal ECK1 with the high level. Since the third gate-controlled voltage V3 is maintained at the high level, the second transistor M2, the eighth transistor M8 and the tenth transistor M10 are turned off.

The fourth transistor M4 and the seventh transistor M7 are turned on in response to the second clock signal ECK2 with the low level. In addition, the first gate-controlled voltage V1 is set the low level, so that the fifth transistor M5 and the sixth transistor M6 are turned on.

As the above-mentioned bootstrapped, because of the coupling of the first capacitor C1, the first gate-controlled voltage V1 is bootstrapped by the change of the electric potential of the second clock signal ECK2. I.e., when the second clock signal ECK2 is at the high level in the fourth transmission period t4, the first gate-controlled voltage V1 is still at the low level. When the second clock signal ECK2 changes from the high level to the low level in the fifth transmission period t5, the first gate-controlled voltage V1 is further reduced and even lower the voltage of the second power input terminal VGL because of the coupling (bootstrap effect) of the first capacitor C1. The large decrease in the first gate-controlled voltage V1 also affects the fifth transistor M5. When the gate of the fifth transistor M5 is directly connected to the first gate voltage control node A, and the drain of the fifth transistor M5 is connected to the first power input terminal VGH (the high level), then the voltage between the gate and the source will be too large that will cause breakdown damage. In order to avoid this risk, the present embodiment adds the sixteenth transistor M16. At this time, the source of the sixteenth transistor M16 is connected to the first gate voltage control node A, the gate of the sixteenth transistor M16 is connected to the second power input terminal VGL, and since the first gate-controlled voltage V1 is lower than the voltage of the second power input terminal VGL, the sixteenth transistor M16 is quickly turned off, so that the fifth transistor M5 is isolated from the first gate voltage control node A to prevent the fifth transistor M5 from being damaged.

The second clock signal ECK2 with the low level is applied to the second gate voltage control node B through the turned-on sixth transistor M6 and seventh transistor M7. Therefore, the second gate-controlled voltage V2 is at the low level in the fifth transmission period t5. Since the second gate-controlled voltage V2 is at the low level, the ninth transistor M9 is turned on.

As the ninth transistor M9 is turned on and the tenth transistor M10 is turned off, the first emission control signal is maintained at the high level.

In the sixth transmission period t6, the start signal EIN and the first clock signal ECK1 are at the low level, and the second clock signal ECK2 is at the high level. According to the operation in the first transmission period t1, the first emission control signal is at the low level in the sixth transmission period t6.

To sum up, the above-mentioned embodiments describe the different configurations of an emission control driving circuit in detail. Of course, the present application includes, but is not limited to, the configurations listed in the above embodiments. Any changes made to the configuration provided by the above-mentioned embodiments are within the scope of the present application. Those skilled in the art can make the same according to the content of the above-mentioned embodiments.

The above are only the preferred embodiments of the present application and are not intended to limit the scope of the present application. Any modifications, equivalent substitutions, improvements etc. made within the spirit and scope of the present application are intended to be included in the scope of the present application.

What is claimed is:

1. An emission control driving circuit, comprising:
    a first gate voltage control circuit, generating a first gate-controlled voltage at a first gate voltage control node according to signals of a first input terminal, a second input terminal and a second power input terminal;
    a second gate voltage control circuit, generating a third gate-controlled voltage at a third gate voltage control node according to the first gate-controlled voltage and the signals of the first input terminal, the second input terminal, a third input terminal, a first power input terminal and the second power input terminal; and
    an isolation circuit connected to the second power input terminal, the first gate voltage control circuit and the second gate voltage control circuit; wherein
    when the first gate-controlled voltage is lower than a voltage value of the second power input terminal, the isolation circuit isolates the first gate voltage control node from the first gate voltage control circuit and/or the second gate voltage control circuit; or
    when the third gate-controlled voltage is lower than the voltage value of the second power input terminal, the isolation circuit isolates the third gate voltage control node from the first gate voltage control circuit and/or the second gate voltage control circuit.

2. The emission control driving circuit of claim 1, wherein the second gate voltage control circuit further generates a second gate-controlled voltage at a second gate voltage control node, and the emission control driving circuit further comprises:
an output circuit, generating an output signal at an output terminal according to the second gate-controlled voltage, the third gate-controlled voltage, and signals of the first power input terminal and the second power input terminal.

3. The emission control driving circuit of claim 2, wherein
when the first gate-controlled voltage is lower than the voltage value of the second power input terminal, the isolation circuit isolates the first gate voltage control node from the first gate voltage control circuit and the second gate voltage control circuit; and
when the third gate-controlled voltage is lower than the voltage value of the second power input terminal, the isolation circuit isolates the third gate voltage control node from the second gate voltage control circuit.

4. The emission control driving circuit of claim 2, wherein
when the first gate-controlled voltage is lower than the voltage value of the second power input terminal, the isolation circuit isolates the first gate voltage control node from the first gate voltage control circuit; and
when the third gate-controlled voltage is lower than the voltage value of the second power input terminal, the isolation circuit isolates the third gate voltage control node from the first gate voltage control circuit and the second gate voltage control circuit.

5. An emission control driver, comprising at least two emission control driving circuits of claim 2, wherein the at least two emission control driving circuits are connected sequentially, the first input terminal of the emission control driving circuit is connected to the output terminal of adjacent emission control driving circuit.

6. The emission control driver of claim 5, wherein the first input terminal of each emission control driving circuit receives a start signal or an output signal of the emission control driving circuit, the second input terminal of an odd emission control driving circuit receives a first clock signal, the third input terminal of the odd emission control driving circuit receives a second clock signal; and the second input terminal of an even emission control driving circuit receives the second clock signal, the third input terminal of the even emission control driving circuit receives the first clock signal.

7. The emission control driver of claim 6, wherein the first clock signal and the second clock signal have same transmission periods, the first clock signal and the second clock signal have non-overlapping clock signals, when a second falling edge voltage of the first clock signal comes, the start signal changes to a rising edge voltage and maintains a high level voltage until a fourth falling edge voltage of the first clock signal comes.

8. An organic light emitting display device, comprising the emission control driver as claimed in claim 5.

9. The emission control driving circuit of claim 1, wherein the first gate voltage control circuit comprises a first transistor, a second transistor and a third transistor; wherein
a gate of the first transistor is connected to the second input terminal, a source of the first transistor is connected to a gate of the second transistor, and a drain of the first transistor is connected to the first input terminal;
a source of the second transistor is connected to the second input terminal, a drain of the second transistor is connected to a source of the third transistor, and the gate of the second transistor is further connected to the second gate voltage control circuit; and
a gate of the third transistor is connected to the second input terminal, a drain of the third transistor is connected to the second power input terminal, and a source of the third transistor is further connected to the second gate voltage control circuit.

10. The emission control driving circuit of claim 9, wherein the first transistor, the second transistor and the third transistor are P-type thin film transistors.

11. The emission control driving circuit of claim 9, wherein the second gate voltage control circuit comprises a fourth transistor, a fifth transistor, a sixth transistor, a seventh transistor, an eighth transistor and a first capacitor; wherein
a gate of the fourth transistor is connected to the third input terminal, a source of the fourth transistor is connected to a source of the fifth transistor, and a drain of the fourth transistor is connected to the gate of the second transistor;
a gate of the fifth transistor is connected to the source of the third transistor, and a drain of the fifth transistor is connected to the first power input terminal;
a gate of the sixth transistor is connected to the source of the third transistor, a source of the sixth transistor is connected to a source of the seventh transistor, and a drain of the sixth transistor is connected to the third input terminal;
a gate of the seventh transistor is connected to the third input terminal, and a drain of the seventh transistor is connected to a source of the eighth transistor;
a gate of the eighth transistor is connected to the first input terminal and the output circuit, a drain of the eighth transistor is connected to the first power input terminal, and the source of the eighth transistor is further connected to the output circuit; and
one end of the first capacitor is connected to the gate of the sixth transistor, and the other end is connected to the source of the sixth transistor.

12. The emission control driving circuit of claim 11, wherein the fourth transistor, the fifth transistor, the sixth transistor, the seventh transistor and the eighth transistor are P-type thin film transistors.

13. The emission control driving circuit of claim 11, wherein the output circuit comprises a ninth transistor, a tenth transistor, a second capacitor and a third capacitor; wherein
a gate of the ninth transistor is connected to the source of the eighth transistor, a source of the ninth transistor is connected to the first power input terminal, and a drain of the ninth transistor is connected to a source of the tenth transistor;
a gate of the tenth transistor is connected to the gate of the eighth transistor, and a drain of the tenth transistor is connected to the second power input terminal;
one end of the second capacitor is connected to the gate of the ninth transistor, and the other end is connected to the source of the ninth transistor;
one end of the third capacitor is connected to the gate of the tenth transistor, and the other end is connected to the third input terminal; and
an output signal generated by the output circuit is output from the source of the tenth transistor.

14. The emission control driving circuit of claim 13, wherein the ninth transistor and the tenth transistor are P-type thin film transistors.

15. The emission control driving circuit of claim 13, wherein the isolation circuit comprises an eleventh transistor, a twelfth transistor and a thirteenth transistor; wherein
the eleventh transistor is connected between the source of the third transistor and the gate of the sixth transistor, a gate of the eleventh transistor is connected to the second power input terminal, a source of the eleventh transistor is connected to the source of the third transistor, and a drain of the eleventh transistor is connected to the gate of the sixth transistor;
the twelfth transistor is connected between the gate of the fifth transistor and the gate of the sixth transistor, a gate of the twelfth transistor is connected to the second power input terminal, a drain of the twelfth transistor is connected to the gate of the fifth transistor, and a source of the twelfth transistor is connected to the gate of the sixth transistor; and
the thirteenth transistor is connected between the gate of the eighth transistor and the gate of the tenth transistor, a gate of the thirteenth transistor is connected to the second power input terminal, a drain of the thirteenth transistor is connected to the gate of the tenth transistor, and a source of the thirteenth transistor is connected to the gate of the eighth transistor.

16. The emission control driving circuit of claim 15, wherein the eleventh transistor, the twelfth transistor and the thirteenth transistor are P-type thin film transistors.

17. The emission control driving circuit of claim 15, wherein the first gate-controlled voltage is input to the gate of the sixth transistor, the second gate-controlled voltage is input to the gate of the ninth transistor; and the third gate-controlled voltage is input to the gate of the tenth transistor.

18. The emission control driving circuit of claim 13, wherein the isolation circuit comprises a fourteenth transistor, a sixteenth transistor and a fifteenth transistor; wherein the fourteenth transistor is connected between the gate of the second transistor and the gate of the tenth transistor, a gate of the fourteenth transistor is connected to the second power input terminal, a source of fourteenth transistor is connected to the gate of the second transistor, and a drain of the fourteenth transistor is connected to the gate of the tenth transistor;
the sixteenth transistor is connected between the gate of the fifth transistor and the gate of the sixth transistor, a gate of the sixteenth transistor is connected to the second power input terminal, the a drain of the sixteenth transistor is connected to the gate of the fifth transistor, and a source of the sixteenth transistor is connected to the gate of the sixth transistor; and
the fifteenth transistor is connected between the gate of the eighth transistor and the gate of the tenth transistor, a gate of the fifteenth transistor is connected to the second power input terminal, a drain of the fifteenth transistor is connected to the gate of the tenth transistor and the drain of the fourteenth transistor, and a source of the fifteenth transistor is connected to the gate of the eighth transistor.

19. The emission control driving circuit of claim 18, wherein the fourteenth transistor, the sixteenth transistor and the fifteenth transistor are P-type thin film transistors.

20. The emission control driving circuit of claim 1, wherein the first gate voltage control circuit includes at least one transistor, one of the at least one transistor connects the first gate-controlled voltage or the third gate-controlled voltage;
the second gate voltage control circuit includes at least two transistors, one of the at least two transistors connects the first gate-controlled voltage, another one of the at least two transistors connects the third gate-controlled voltage.

* * * * *